United States Patent
Hawat

(10) Patent No.: US 8,387,854 B2
(45) Date of Patent: Mar. 5, 2013

(54) METHOD FOR MOUNTING A THREE-AXIS MEMS DEVICE WITH PRECISE ORIENTATION

(75) Inventor: Noureddine Hawat, Wilmington, MA (US)

(73) Assignee: Memsic, Inc., Andover, MA (US)

(*) Notice: Subject to any disclaimer, the term of this patent is extended or adjusted under 35 U.S.C. 154(b) by 0 days.

(21) Appl. No.: 13/402,210

(22) Filed: Feb. 22, 2012

(65) Prior Publication Data

US 2012/0217286 A1 Aug. 30, 2012

Related U.S. Application Data

(60) Provisional application No. 61/446,689, filed on Feb. 25, 2011.

(51) Int. Cl.
*B23K 31/02* (2006.01)

(52) U.S. Cl. .............. 228/180.22; 228/170; 438/584

(58) Field of Classification Search ............. 228/170, 228/180.22; 438/108, 584
See application file for complete search history.

(56) References Cited

U.S. PATENT DOCUMENTS

| | | | | | |
|---|---|---|---|---|---|
| 5,461,261 | A | * | 10/1995 | Nishiguchi | 257/737 |
| 2003/0036219 | A1 | * | 2/2003 | Masumoto et al. | 438/107 |
| 2007/0170228 | A1 | * | 7/2007 | Zhao et al. | 228/102 |

\* cited by examiner

*Primary Examiner* — Nicholas P D'Aniello
(74) *Attorney, Agent, or Firm* — Preti Flaherty Beliveau & Pachios LLP

(57) ABSTRACT

This invention uses surface tension to align a z-axis MEMS sensing device that is mounted onto a substrate or lead frame oriented in an xy-plane. According to the teachings of the present invention, the height of the z-axis sensing device is less than or substantially equal to its width (y-dimension) while the length of the device in the longitudinal direction (x-dimension) is greater than either of the y- or z-dimensions. As a result, instead of being thin and tall like a wall, which configuration is extremely difficult to align vertically, the elongate z-axis sensing device is mounted on a short z-axis, making it easier to align vertically.

12 Claims, 1 Drawing Sheet

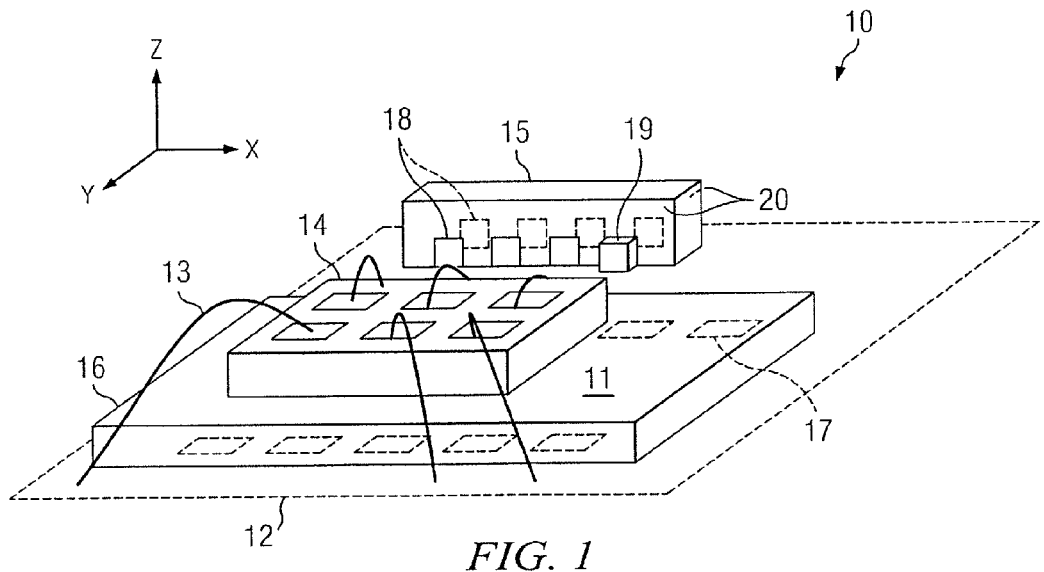
*FIG. 1*
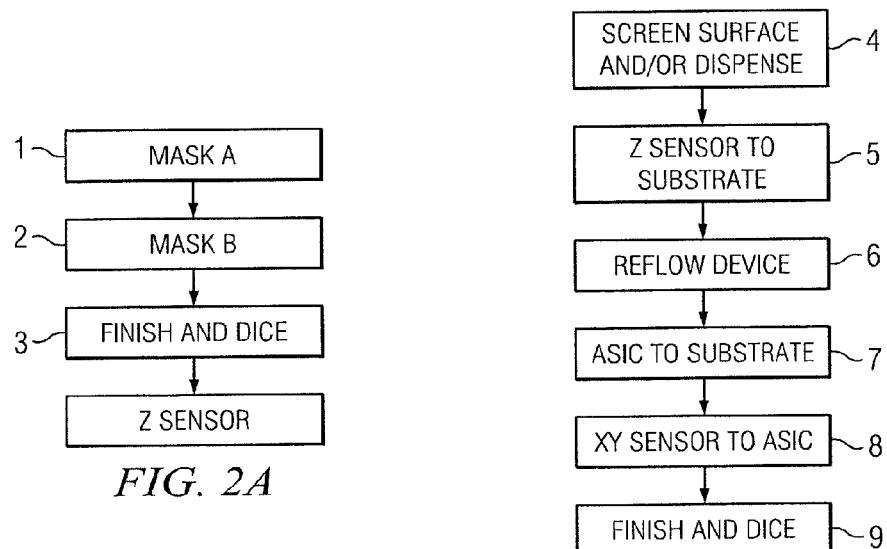
*FIG. 2A*
*FIG. 2B*

METHOD FOR MOUNTING A THREE-AXIS MEMS DEVICE WITH PRECISE ORIENTATION

CROSS-REFERENCE TO RELATED APPLICATION

This applications claims priority of U.S. Provisional Patent Application Ser. No. 61/446,689 for "METHOD FOR MOUNTING A THREE-AXIS MEMS DEVICE WITH PRECISE ORIENTATION," filed Feb. 25, 2011.

STATEMENT REGARDING FEDERALLY SPONSORED RESEARCH OR DEVELOPMENT

N/A

BACKGROUND OF THE INVENTION

The current trend of incorporating navigation technology into compact devices requires two- and three-axis micro-electro-mechanical system (MEMS) sensors that are compact in the xy-plane and that have a minimum height in the z-axis. However, mounting z-axis (MEMS) sensing devices remains a challenge to be cost effective for applications of limited space and high volume in the packaging industry.

SUMMARY OF INVENTION

This invention uses surface tension to align a z-axis MEMS sensing device that is mounted onto a substrate or lead frame oriented in an xy-plane. According to the teachings of the present invention, the height of the z-axis sensing device is less than or substantially equal to its width (y-dimension) while the length of the device in the longitudinal direction (x-dimension) is greater than either of the y- or z-dimensions. As a result, instead of being thin and tall like a wall, which configuration is extremely difficult to align vertically, the elongate z-axis sensing device is mounted on a short z-axis, making it easier to align vertically.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 1 provides a diagrammatic view of a z-axis-mounted MEMS sensing device on a substrate in accordance with the present invention;

FIG. 2A shows a flow chart of a method for preparing a z-axis sensing device for mounting on a substrate or lead frame in accordance with the present invention; and FIG. 2B shows a flow chart of a method for mounting a three-axis MEMS sensing device on a substrate or lead frame at precise angles.

DETAILED DESCRIPTION OF THE INVENTION

U.S. Provisional Patent Application Ser. No. 61/446,689 for "METHOD FOR MOUNTING A THREE-AXIS MEMS DEVICE WITH PRECISE ORIENTATION," filed Feb. 25, 2011 is incorporated in its entirety herein.

Referring to FIG. 1 a compact MEMS device 10 is shown. The MEMS device 10 includes a substrate 12, e.g., a lead frame, that is oriented in an xy-plane. The substrate includes a plurality of bonding pads 17 for mechanically and electrically coupling a first sub-system, e.g., an application-specific integrated chip (ASIC) 16, or multiple subsystems on the substrate 12, and a bonding pattern (not shown) for mechanically and electrically coupling a second sub-system, e.g., a z-axis sensing device 15, on the substrate 12.

The ASIC 16 can be electrically and mechanically coupled to the substrate 12, e.g., by flip-chip techniques using a plurality of corresponding bond pads 17. To minimize the size of the device 10, a multi-axis sensing device 14, e.g., an xy-sensing device, is mechanically coupled to a top surface 11 of the ASIC 16. Optionally, the xy-sensing device 14 includes a plurality of wire leads 13 that can be electrically coupled e.g., by wire-bonding, to corresponding bonding pads on the ASIC 15 and/or to corresponding bonding pads on the substrate 12.

The z-axis sensing device 15 is mounted onto the bonding pattern on the substrate 12, separately from the xy-sensing device 14. Advantageously, in preparation for receiving the z-axis sensing device 15 for the purposes of electrically and mechanically coupling the z-axis sensing device 15 to the substrate 12, a bonding pattern (not shown) is provided on or applied to the surface of the substrate 12, e.g., by at least one of screen printing, dispensing, and the like.

The height of the z-axis sensing device 15 (along the z-axis) is less than or substantially equal to the width of the z-axis sensing device 15 (along the y-axis). Moreover, the length of the z-axis sensing device 15 (along the x-axis) is much greater than or equal to either the height and/or the width. Advantageously, instead of the z-axis sensing device 15 being thin and tall, which makes precise vertical alignment extremely difficult, the elongate but relatively-short z-axis sensing device 15 can be precisely aligned.

Typically, according to common practice, bond pads 18 on the bottom of the z-axis sensing device 15 would be placed in registration with bonding pads 17 disposed on the substrate 12 and the bond pads 18 would be mechanically and electrically coupled to the bonding pads 17, e.g., by soldering. According to the present invention, however, as shown in FIG. 1, the z-axis sensing device 15 includes a plurality of bond pads 18 that are arrayed on one or both opposing longitudinal sides 20 of the z-axis sensing device 15, perpendicular or substantially perpendicular to the xy-plane of the substrate 12.

The bond pads 18 on one or both sides 20 of the z-axis sensing device 15 typically includes an electrically-conductive layer, e.g., copper layer, and a tin layer.

A method of fabricating the three-axis MEMS sensing device 10 will now be described. More particularly, referring to FIG. 2A, a method of preparing a z-axis sensing device 15 for precision vertical alignment and mounting on a substrate 12 is shown. Furthermore, referring to the flow chart in FIG. 2B, a method of integrating a three-axis MEMS sensing device 10 at a precise vertical orientation on a substrate 12 in relation to the xy-plane will be described.

Although the invention will be described in a sequence that includes attaching the z-axis sensing device 15 to the substrate 12 before attaching the ASIC 16, it is possible to reverse that sequence. Notwithstanding, in either case, prior to coupling the z-axis sensing device 15 to the substrate 12, each of the bond pads 18 that are disposed on one or both opposing longitudinal sides 20 of the z-axis sensing device 15 must be prepared. In a first preparation step, each of the bond pads 18 is masked using a first mask (MASK A) before an electrically-conductive material is applied to the mask (STEP 1). The applied electrically-conductive material should cover the bond pads 18 completely. Although the disclosure will refer to this step as "copper coating", those of ordinary skill in the art can appreciate that the electrically-conductive coating material can be copper, silver, gold, platinum, combinations thereof, alloys thereof, and the like. The thickness of the copper coating can be about 100 micrometers or less.

Subsequently, the electrically-conductive, copper-coated portions of the z-axis sensing device 15 are masked using a second mask (MASK B), and, then, the copper-coated portions within masked portions are coated or screened with a solder material, e.g., tin (STEP 2). To ensure that the tin coating 19 completely covers the copper coating, the mask openings of MASK B are slightly larger in all dimensions than the mask openings of MASK A. The variation between MASK A and MASK B will produce a relatively thick coating of tin 19, e.g., 50 micrometers or more, that encases or covers the underlying plated copper completely. The z-axis sensing device 15 is then finished and diced (STEP 3) and ready for application to the substrate 12.

Referring now to FIG. 2B, in preparation for mounting the z-axis sensing device 15 on the substrate 12, a bonding pattern (not shown) should be prepared on some portion of the surface of the substrate 12, e.g., by screen printing, dispensing, and the like (STEP 4). Screen printing and/or dispensing can be performed using a flux material, a solder paste, an underfill material, a combination thereof, and the like. The bonding pattern provides bonding areas that are located to be in registration with the plurality of tin-coated portions 19.

Once the desired bonding pattern has been applied or provided on the surface of the substrate 12, the tin-coated portions 19 of the z-axis sensing device 15 can be mechanically and electrically coupled to bonding areas of the bonding pattern (STEP 5). Advantageously, the z-axis sensing device 15 remains perpendicular or substantially perpendicular to the surface of the substrate 12 to ensure precise vertical alignment of the z-axis sensing device 15. In one embodiment, the tin-coated portions 19 of the z-axis sensing device 15 are oriented in registration with corresponding bonding areas of the bonding pattern before the surface of the substrate 12 is reflowed (STEP 6), to fixedly mount the z-axis sensing device 15. The reflow process (STEP 6) preserves the perpendicular or substantially perpendicular alignment of the z-axis sensing device 15 with respect to the substrate 12.

Once the z-axis sensing device 15 has been mounted on the substrate 12 (STEP 5) and reflow process has been completed (STEP 6), the ASIC die 16 is electrically and mechanically coupled to the substrate 12 (STEP 7). This coupling can be accomplished using flip-chip methodology. Subsequently, the xy-sensing device 14 can be mechanically coupled to the top surface 11 of the ASIC device 16 (STEP 8) and the wire leads 13 from the xy-sensing device 14 can be electrically coupled to corresponding bonding pads 17 on the substrate 12 and/or to corresponding bonding pads (not shown) on the ASIC 16 (STEP 8), e.g., by wire-bonding. Alternatively, the xy-sensing device 14 can be mechanically coupled to the top surface 11 of the ASIC device 16 prior to mounting the ASIC device 16 to the substrate 12.

Once the xy-sensing device 14 is mechanically coupled to the ASIC device 16 and electrically coupled to the ASIC device 16 and/or bonding pads on the substrate 12 and the ASIC device is electrically and mechanically coupled to the substrate, the entire substrate 12 can be finished, e.g., by mold injection, and diced (STEP 9).

Advantageously, this invention enables an accurate vertical mounting in mass production of a smaller package with a reduced cost, and could be processed on an organic substrate technology such as LGA or BGA or lead frame technology as well as QFN, TLA, and/or HLA. Although the invention has been described assuming that the z-axis sensing device 15 is rotated 90 degrees so that the bond pads 18 are oriented perpendicular to the xy-plane, and then placed onto the xy-surface of the substrate 12, alternatively, the z-axis sensing device 15 could be pre-packaged and pre-oriented before the fabrication process and placed in the correct orientation, e.g., in a waffle pack or in a reel-and-tape, to facilitate and expedite mounting.

Although the invention is described through the above-described exemplary embodiments, it will be understood by those of ordinary skill in the art that modifications to, and variations of, the illustrated embodiments can be made without departing from the inventive concepts disclosed herein. Accordingly, the invention should not be viewed as limited, except by the scope and spirit of the appended claims.

What may be claimed is:

1. A method of integrating a three-dimensional micro-electro-mechanical system (MEMS) sensing device at precise angles on a substrate having a surface oriented in an xy-plane, the method comprising:
   coating bond pads arrayed on at least one of opposing longitudinal sides of a z-axis sensing device with an electrically-conductive material using a first mask with openings;
   completely covering the electrically-conductive material on the bond pads in all dimensions with a solder material using a second mask, wherein the second mask has openings that are larger than the openings in the first mask;
   providing a bonding pattern for the z-axis sensing device on some portion of the substrate;
   mechanically and electrically coupling the solder material on corresponding bonding areas of the bonding pattern provided on the substrate; and
   electrically coupling and mechanically coupling a two-axis (xy-) sensing device to the surface of the substrate.

2. The method as recited in claim 1, wherein coating bond pads arrayed on opposing longitudinal sides of the z-axis sensing includes using electrically-conductive material selected from the group consisting of copper, silver, gold, platinum, and alloys and combinations thereof.

3. The method as recited in claim 1, wherein the solder material is selected from the group consisting of tin and tin alloys.

4. The method as recited in claim 1, wherein attaching the two-dimensional sensing device to the substrate includes mechanically coupling said two-dimensional sensing device to an upper surface of an integrated circuit device and mechanically and electrically coupling the integrated circuit device to the substrate.

5. The method as recited in claim 4, wherein the integrated circuit device is attached to the substrate using flip chip methods.

6. The method as recited in claim 1 further comprising:
   mold injecting the substrate; and
   dice-cutting the substrate.

7. The method as recited in claim 1, wherein the second mask is structured and arranged to cover the electrically-conductive material completely.

8. The method as recited in claim 1, wherein the electrically-conductive material is applied to have a thickness of approximately 100 micrometers.

9. The method as recited in claim 1, wherein the solder material is applied to have a thickness of approximately 50 micrometers.

10. The method as recited in claim 1, wherein providing a bonding pattern includes at least one of screen printing a pattern and dispensing a pattern on the substrate.

11. The method as recited in claim 10, wherein the at least one of screen printing a pattern and dispensing a pattern includes using a material selected from the group consisting of a flux material, a solder paste, an under-fill material, and combinations thereof.

12. The method as recited in claim 1, wherein mechanically and electrically coupling the solder material on corresponding portions of the bonding pattern disposed on the substrate includes reflow techniques.

* * * * *